US006192291B1

(12) United States Patent
Kwon

(10) Patent No.: US 6,192,291 B1
(45) Date of Patent: Feb. 20, 2001

(54) METHOD OF CONTROLLING SEMICONDUCTOR FABRICATING EQUIPMENT TO PROCESS WAFERS OF A SINGLE LOT INDIVIDUALLY

(75) Inventor: Dae-hong Kwon, Kyonggi-do (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/168,093

(22) Filed: Oct. 8, 1998

(30) Foreign Application Priority Data

Jan. 14, 1998 (KR) ..................................... 98-805

(51) Int. Cl.[7] ..................................................... G06F 19/00
(52) U.S. Cl. ............................. 700/121; 700/95; 700/96; 118/707; 118/719; 118/663
(58) Field of Search .............................. 700/95, 96, 121; 118/707, 719, 663

(56) References Cited

U.S. PATENT DOCUMENTS

| 5,885,355 | * | 3/1999 | Song et al. ............................ 118/719 |
| 5,940,299 | * | 8/1999 | Choi et al. ............................ 700/121 |
| 5,965,947 | * | 8/1999 | Nam et al. ............................ 257/783 |
| 5,997,656 | * | 12/1999 | Kim .......................................... 134/18 |
| 6,083,320 | * | 7/2000 | Lee ........................................ 118/58 |
| 6,090,632 | * | 7/2000 | Jeon et al. ............................. 438/14 |

OTHER PUBLICATIONS

Wilcox, R.;Forhan, T.; Starkey, G.; Turner, D., Advanced Semiconductor Manufacturing Conference and Workshop, IEEE/SEMI, pp. 308–313, 1998.*

Westphal,H.; Gramlich, S., Automation structure of a semiconductor fabrication using factory com, Industrial Electronics Society, Conference of the IEEE, vol. 1, pp. 160–163, 1998.*

D.A. Hodges; L.A. Rowe; C.J. Spanos, Computer Integrated Manufacturing, IEEE/CHMT, pp. 1–3, 1998.*

* cited by examiner

Primary Examiner—William Grant
Assistant Examiner—Victoria Robinson
(74) Attorney, Agent, or Firm—Jones Volentine, LLC

(57) ABSTRACT

A module of a host computer of a semiconductor fabrication management system receives from an operator a plurality of IDs assigned by the operator to each of the wafers, respectively, received in the slots of a wafer cassette. The module searches a database of the host computer to correlate each received wafer ID with a process step ID, and the process step ID with a process program ID (PPID). Process condition data is formulated from the correlated process step IDs and PPIDs. At this point, the semiconductor fabrication management system is used to determine whether the operator has inputted a track-in signal to the system. If the track-in signal has been inputted, the processing condition data is downloaded to a server of the semiconductor processing equipment. The downloaded process condition data is used to change, if necessary, an equipment control message stored in the server. The equipment control message is then downloaded to the semiconductor processing equipment to control the semiconductor processing equipment to process the wafers individually as called for by their respective process step IDs and PPIDs. Accordingly, the wafers of even a single lot can be processed individually under conditions specified for that particular wafer as called for by their process step IDs and PPIDs.

5 Claims, 5 Drawing Sheets

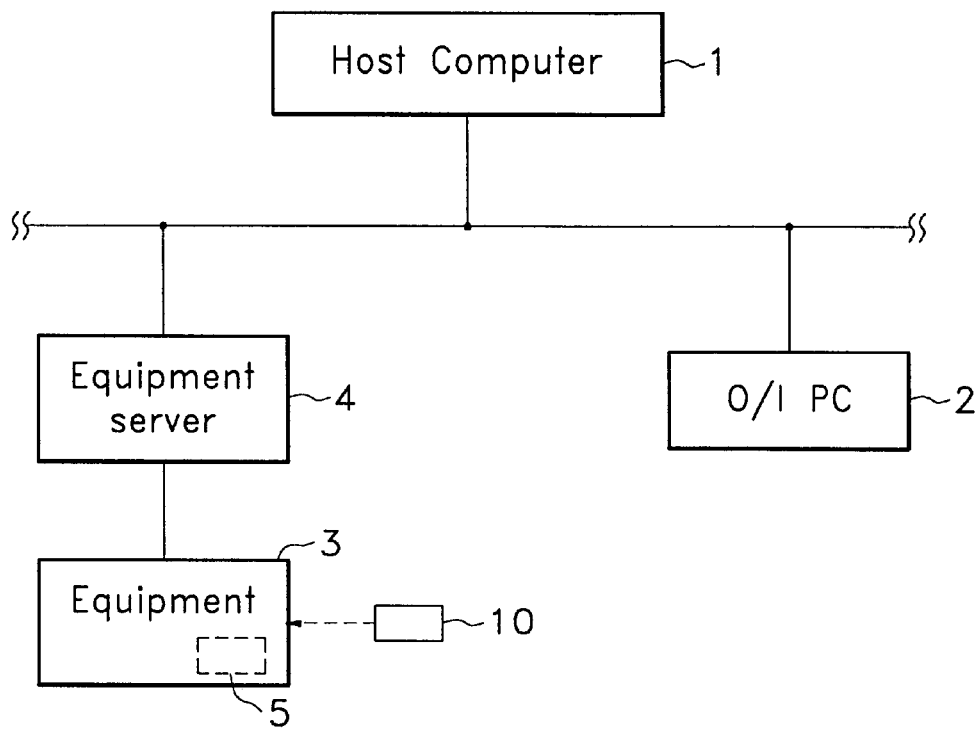

FIG. 5

| Process step ID | PPID |
|---|---|
| A0010 | a1;a2;a3;a4... |
| A0020 | b1;b2;b3;b4... |
| A0030 | c1;c2;c3;c4... |
| A0040 | d1;d2;d3;d4... |
| A0050 | |
| Annnn | n1;n2;n3;n4... |

FIG. 6

```
S2F41 W
    L,2
        <Start>
        L,1
        L,2
        <WAFER>,1
        <Aoo10>
        L,2
        <WAFER>,2
        <Aoo20>
            ⋮
        L,2
        <SLOT_PPID>,1
        <1_a1>
        L,2
        <SLOT_PPID>,2
        <2_b1>
            ⋮
```

METHOD OF CONTROLLING SEMICONDUCTOR FABRICATING EQUIPMENT TO PROCESS WAFERS OF A SINGLE LOT INDIVIDUALLY

BACKGROUND OF THE INVENTION

1. Field of the Invention

The present invention relates to a method of controlling semiconductor fabricating equipment. More particularly, the present invention relates to a method of controlling semiconductor fabricating equipment so that the individual wafers of a single lot can be processed individually by the equipment under conditions ideally suited for each wafer considering the product into which the wafer is to be made.

2. Description of the Related Art

Semiconductor devices are fabricated by the execution of numerous processes with an extremely high degree of precision. These precise processes are carried out by highly functional equipment arranged along a semiconductor fabricating line. The elaborate operations of the equipment are monitored by operators through a management system to enhance the operation efficiency of the equipment.

Referring to FIG. 1, a plurality of wafers are inserted into the slots of a cassette, respectively, to form a lot 10 of intermediate semiconductor device products. This lot is transported to semiconductor fabricating equipment 3 of a fabricating line. The operator monitors the operation of the equipment 3 through an operator interface personal computer (O/I PC) 2 that is on-line with the equipment 3. The equipment 3 is also connected on-line to a host computer 1 through an equipment server 4. The host computer 1 is on-line with the O/I PC 2.

The operator inputs basic fabricating data, e.g., the ID of the lot 10 to be processed in the equipment 3, into the host computer 1 through the O/I PC 2. Based on the inputted basic fabricating data, the host computer 1 searches its database for appropriate data by which the equipment 3 will be controlled to process the lot 10. The database, as shown in FIG. 2, comprises process step IDs and a process program IDs (PPIDs). The data selected from the database is used by the host computer 1 for calculating process condition control data. The process condition control data is issued to the equipment server 4 for controlling the equipment 3 to process all of the wafers of the lot the same way.

For example, once an operator inputs a wafer lot ID, e.g. 'A', into the host computer 1 via the O/I PC 2, the host computer 1 assigns a process step ID, e.g. 'A0010' corresponding to the wafer lot ID specified by the operator. Based on the database (FIG. 2) stored in the host computer 1, the host computer 1 also tags the lot with the PPID 'a' corresponding to the process step ID 'A0010'. Then, the host computer 1 formulates the process condition data necessary to cause the equipment 3 to process the wafers of the lot according to the conditions associated with a PPID of 'a'.

Thereafter, the operator checks the process condition data and inputs a process commencing command or a process terminating command. If the process condition data is acceptable and the process commencing command is inputted, the process condition data is downloaded into the equipment server 3. The wafers of the lot are removed from the slots of the cassette and are placed in a plurality of chambers of the processing equipment, and equivalent conditions are established in each of the chambers so that each of the wafers are processed similarly according to the PPID 'a'.

Unfortunately, the host computer 1 of the conventional semiconductor device fabrication management system can only assign one process step ID and PPID to the lot of wafers. A single process step ID and PPID can not be used by the equipment server to control the processing equipment in a manner in which the wafers are processed differently according to certain needs of the production line.

Such a problem is especially disadvantageous when processing large scale wafers. Large scale wafers can produce a great variety of end products. However, the conventional semiconductor device fabrication management system does not allow for the possibility of processing the large scale wafers of a single lot differently from one another, and a variety of end products thus can not be made from a lot of large scale wafers using just the conventional semiconductor device fabrication management system.

SUMMARY OF THE INVENTION

It is therefore an object of the present invention to overcome the limitations and disadvantages of the prior art by providing a method of controlling semiconductor processing equipment in a manner which causes the equipment to process the wafers of a single lot individually.

It is another object of the present invention to provide a method of controlling semiconductor processing equipment in a manner which will process large scale wafers of a single lot differently so as to facilitate the production of a wide variety of products from a single lot of the large scale wafers.

To achieve the above objects, the present invention provides a method of controlling semiconductor processing equipment comprising the steps of using a semiconductor fabrication management system to receive, from an operator, IDs assigned to the wafers of a single lot, and to correlate a process step ID with each wafer ID and a PPID with each process step ID, and to control the semiconductor processing equipment to process the wafers individually as called for by their respective process step IDs and PPIDs. More specifically, process condition data is formulated from the correlated process step IDs and PPIDs. At this point, the semiconductor fabrication management system is used to determine whether the operator has inputted a track-in signal to the system. If the track-in signal has been inputted, the processing condition data is downloaded to a server of the semiconductor processing equipment. The downloaded process condition data is used to change, if necessary, an equipment control message stored in the server. The equipment control message is then downloaded to the semiconductor processing equipment to control the semiconductor processing equipment to process the wafers individually as called for by their respective process step IDs and PPIDs.

The wafer IDs, process step IDs and PPIDs can be easily correlated by establishing a correlation database in a host computer of the semiconductor fabrication management system. A module of the host computer is used to receive the wafer IDs and search the database for the process step ID associated with each wafer ID, and then for the PPID associated with the found process step ID.

Preferably, the equipment control message comprises a stream function message onto which the process condition data can be coded. The stream function message preferably has an S2F41 format.

With the conventional management system, a plurality of wafers grouped as a lot can not be processed differently from one another if need be, because only one process step ID and PPID can be assigned to the entire lot of wafers. On the other hand, the present invention allows various process step IDs and PPIDs to be assigned to each of the wafers grouped in a single lot. Accordingly, the wafers can be processed under conditions unique to each of the wafers.

BRIEF DESCRIPTION OF THE DRAWINGS

The above and other objects, features and advantages of the present invention will become more apparent by referring to the following detailed description of the preferred embodiments thereof made with reference to the accompanying drawings, of which:

FIG. 1 is a schematic diagram of a conventional semiconductor fabricating equipment management system;

FIG. 2 is a table of process step ID and PPID data stored in the memory of the host computer of the conventional semiconductor fabricating equipment management system;

FIG. 5 is a table of process step ID and PPID data stored in the memory of the host computer of semiconductor fabricating equipment management system according to the present invention;

FIG. 6 is a conceptualization of the content of an equipment control message executed according to the present invention.

DETAILED DESCRIPTION OF THE PREFERRED EMBODIMENTS

The preferred embodiment of the present invention now will be described more fully hereinafter with reference to the accompanying drawings.

Figure 3:
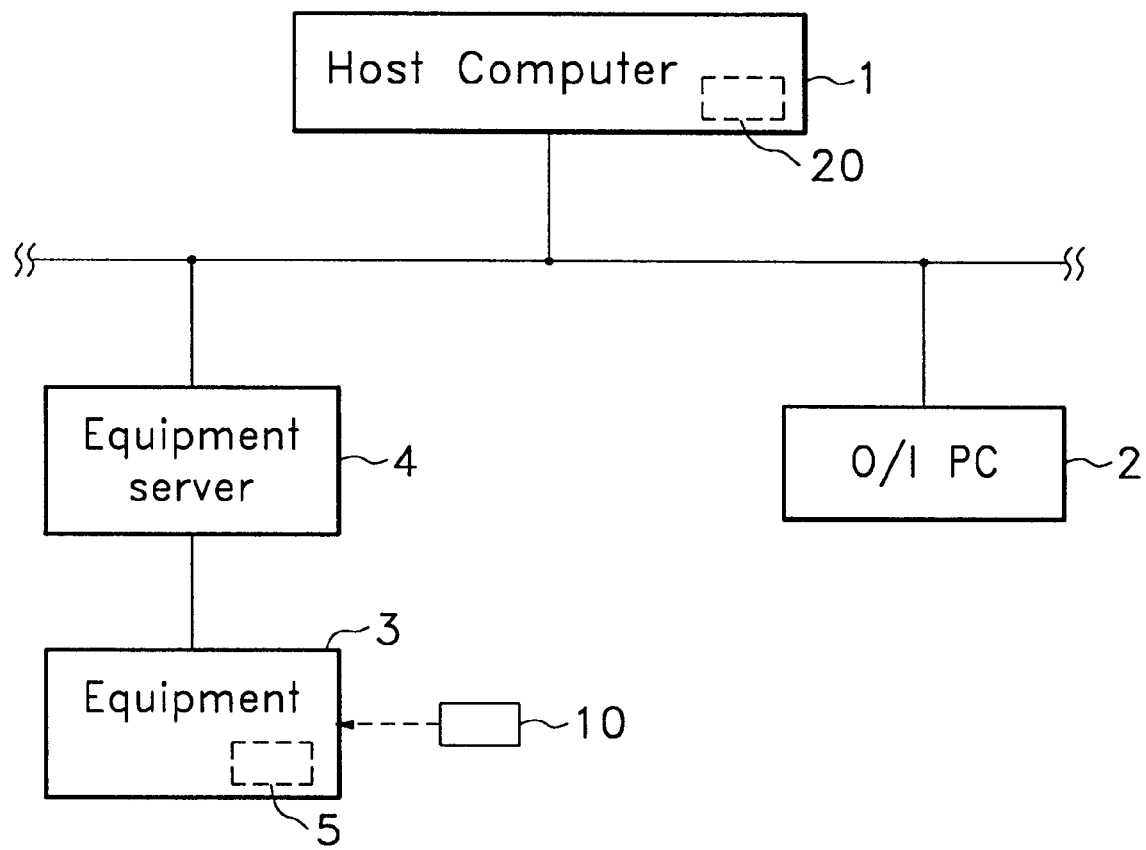
FIG. 3 is a schematic diagram of an embodiment of a semiconductor fabricating equipment management system according to the present invention therein.
Figure 7:
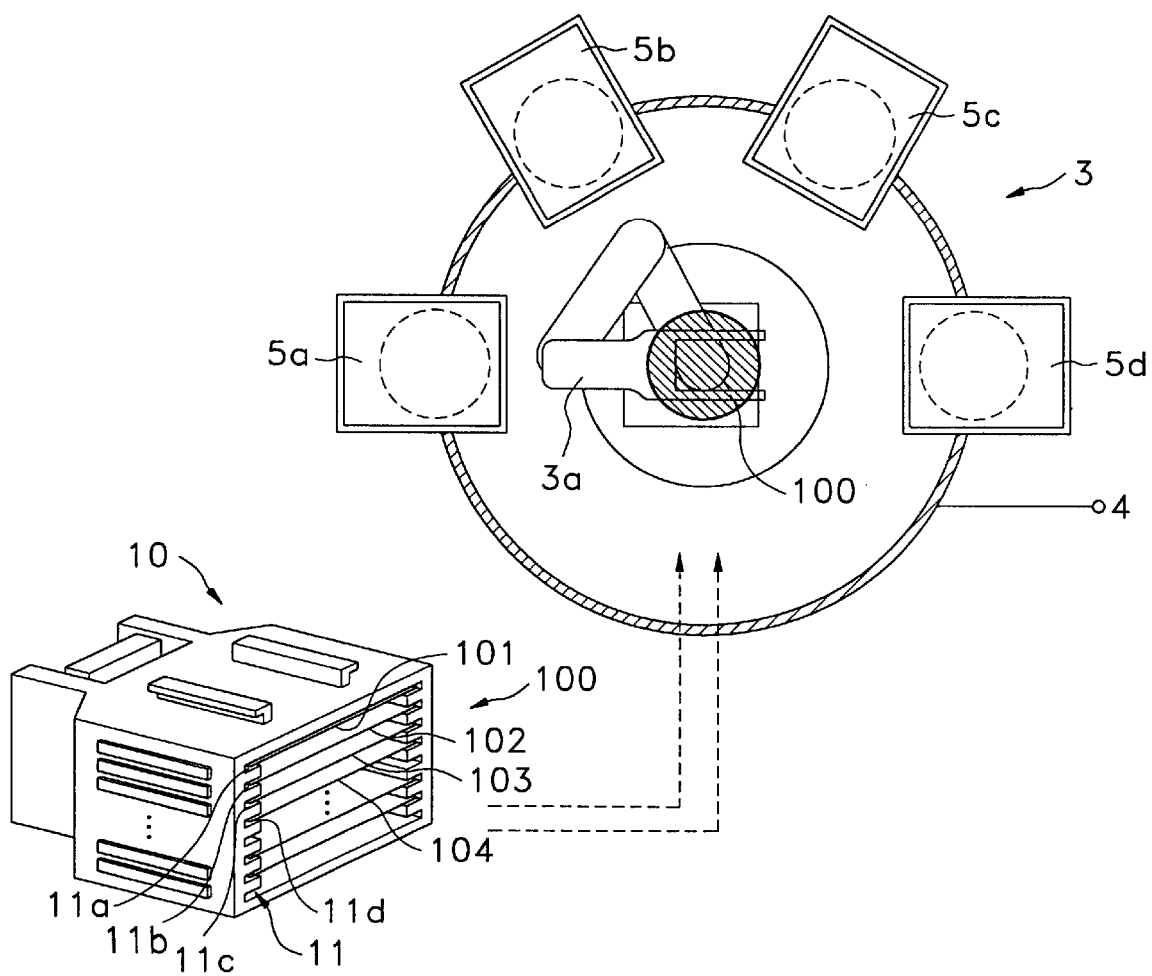
FIG. 7 is a schematic diagram of a piece of semiconductor device fabricating equipment managed by the system of the present invention.

As shown in FIG. 3, a host computer 1 includes a processing condition combining module 20 which is capable of receiving IDs of respective wafers of a single lot, inputted thereto by an operator via an O/I PC, and of correlating each wafer ID with a process step ID and a PPID associated with the wafer ID. The correlated wafer IDs, process step IDs, and PPIDs are converted into processing condition data by the condition combining module 20. This processing condition data is downloaded by the host computer 1 to an equipment server 4 which controls the processing equipment 3 accordingly. The processing equipment, which is shown in more detail in FIG. 7, is configured so that the wafers 100 can be removed from the slots 11 of the cassette 10 one-by-one and can be individually processed under the conditions specified for each wafer according to the processing condition data.

Figure 4:
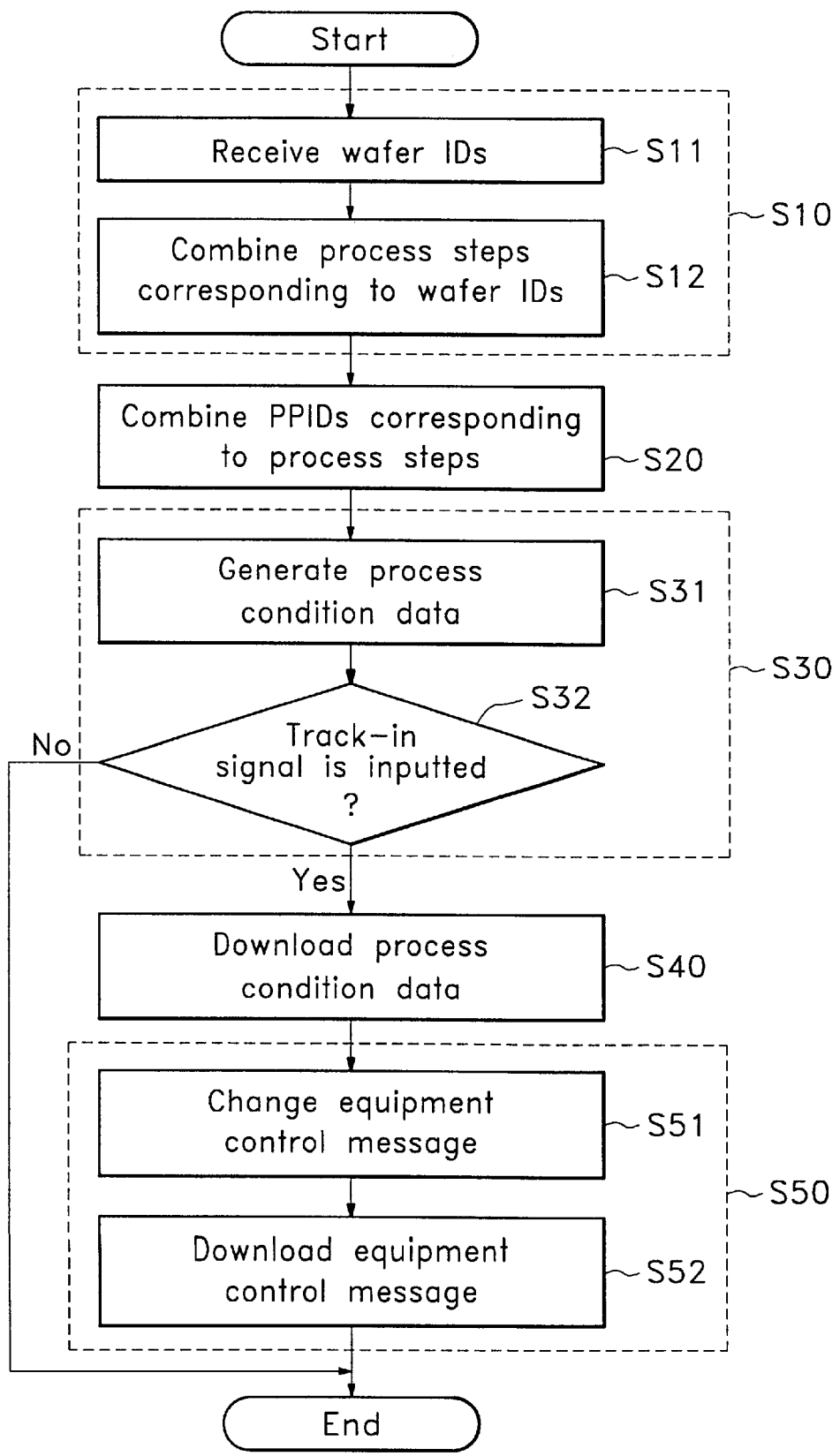
FIG. 4 is a flowchart of a method of controlling processing equipment of a semiconductor fabricating system according to the present invention.

The method by which the processing of the wafers is controlled will be described in more detail with respect to FIGS. 4 and 7. First, the operator inputs basic fabricating data (S10), e.g., IDs of wafers corresponding to the products into which the wafers are to be made, into the process combining module 20 of the host computer 1 via the O/I PC. The process combining module 20 receives the wafer IDs in real time (S11) and thereupon immediately recognizes the existence of the individual wafers 101, 102, . . . in the respective slots 11a, 11b, . . . of the cassette 10.

Thereafter, the process condition combining module 20 searches a database of the host computer. From this database the process condition combining module 20 correlates the wafer IDs with process step IDs (S12), each representing the process step to be carried out on a wafer. For example, when the wafers 100 in a single cassette 10, i.e, of a single lot, are all to be processed differently, the operator inputs a series of wafer IDs that are different from each other, e.g. 1, 2, 3 and 4, which he understands will result in the desired processing of the wafers. Consequently, the process condition combining module 20 searches the database (see FIG. 5) of the host computer and from the database correlates the first wafer 101 received in the first slot 11a of the cassette 10 and now bearing the operator-assigned ID of 1 with a process step ID of 'AA0010'. At the same time the process condition combining module 20 correlates the second wafer 102 received in the second slot 11b of the cassette 10 and bearing the operator-assigned ID of 2 with a process step ID of 'AA0020', correlates the third wafer 103 received in the third slot 11c of the cassette 10 and bearing the operator-assigned ID of 3 with a process step ID of 'AA0030', and correlates the fourth wafer 104 received in the fourth slot 11d of the cassette 10 and bearing an operator-assigned ID of 4 with a process step ID of 'AA0040'. That is, the process condition combining module 20 designates the process(es) to be performed on each of the wafers 100 received in the slots 11 of the cassette.

The process condition combining module 20 also searches the database of the host computer 1 to correlate those process step IDs, now assigned to the wafers, with PPIDs representative of the patterns in which the processes are to be carried out on the wafers, respectively (S20). Following the example given above, the process condition combining module 20 uses the process step ID 'A0010' of the first wafer 101 to assign the PPID of 'a1' to the first wafer 101, uses the process step ID 'A0020' of the second wafer 102 to assign the PPID of 'b2' to the second wafer 102, uses the process step ID 'A0030' of the third wafer 103 to assign the PPID of 'c3' to the third wafer 103, and uses the process step ID 'A0040' of the fourth wafer 104 to assign the PPID of 'd4' to the fourth wafer 104. Now each of the wafers 100 in the slots 11 of the cassette are designated with their own PPIDs.

The host computer 20 is now ready to (S30) to begin controlling the processing equipment via the equipment server 4. First, based on the designations made by the process condition combining module 20, the host computer formulates appropriate process condition data (S31). This process condition data is displayed to the operator via the O/I PC 2. If the operator approves of the data, the operator inputs a track-in signal to the host computer 1 via the O/I PC 2. The host computer monitors the O/I PC to determine whether the operator has decided to input the track-in signal (S32).

If the track-in signal is not inputted, the host computer 1 acknowledges that the operator has decided to delay the processing of the wafers and accordingly terminates the control process. On the other hand, if the track-in signal is inputted, the host computer 1 acknowledges that the operator has approved of the process condition data and as a result, downloads the data to the equipment server 4 (S40).

The equipment server 4 is now ready to control (S50) the processing equipment 3. First, the equipment server 4 processes the process condition data into a corresponding equipment control message, which is to be downloaded to the processing equipment 3, by changing the content of the equipment control message which was previously stored in the server 4 (S51). To do this, the equipment server uses a standard stream function message S2F41 (FIG. 6) onto which the newly formed equipment control message can be loaded to change the content of the standard stream function message.

Specifically, the equipment control message produced according to the example give so far herein, when loaded onto the standard stream function message, changes the process step ID associated with a previously processed first wafer to 'A0010' (i.e, the process step ID of the first wafer 101), the process step ID associated with a previously processed second wafer to 'A0020' (the process step ID of the second wafer 102), the process step ID associated with a previously processed third wafer to 'A0030' (i.e, the process step ID of the third wafer 103), and the process step ID associated with a previously processed fourth wafer to 'A0010' (i.e, the process step ID of the fourth wafer 104). Likewise, the PPIDs are overwritten as well onto the standard stream function message so that the equipment control message now indicates a first PPID (for the wafer 101 in the first slot 11a of the cassette 10) of 'a1', a second PPID (for the wafer 102 in the first slot 11b of the cassette 10) of 'b1', a third PPID (for the wafer 103 in the first slot 11c of the cassette 10) of 'c1', and a fourth PPID (for the wafer 104 in the first slot 11d of the cassette 10) of 'd1'.

The equipment server 4 downloads the so-configured equipment control message to the processing equipment 3 (S52). The use of the standard stream function control message S2F421, in producing the actual equipment control message which is downloaded, facilitates the communication of the equipment server 4 with the processing equipment 3.

The processing equipment 3 processes the wafers 100 individually according to the process step IDs and PPIDs specified in the downloaded equipment control message. For example, a robot arm 3a of the processing equipment 3 removes the first wafer 101 from slot 11a of the cassette 10 and loads the wafer 101 into a first chamber 5a of the equipment 3. The equipment carries out a certain process(es) in the chamber 5a specified by the PPID 'a1' assigned to the first wafer 101. The second wafer 102 is removed from slot 11b and is loaded into chamber 5b of the processing equipment by the robot arm 3a, whereupon the second wafer is processed differently from the first wafer according to the conditions specified by the PPID 'b2' assigned to the second wafer. The third wafer 103 is removed from slot 11c and is loaded into chamber 5c of the processing equipment by the robot arm 3c. Then, the third wafer 103 is processed in the third chamber 5c according to the conditions specified by the PPID 'c3' assigned to the third wafer. Finally, the fourth wafer 104 is removed from slot 11d and is loaded into chamber 5d of the processing equipment by the robot arm 3a, whereupon the fourth wafer is processed according to the conditions specified by the PPID 'd4' assigned to the fourth wafer.

The wafers 100 of a single lot, i.e., received in the same cassette 10, are thus processed under conditions designated for each of them so that they will be made into quality semiconductor products.

The above-described steps are repeated for each cassette 10 of wafers 100 traveling along the semiconductor fabrication line.

By providing a module in the host computer which assigns a process step ID and a PPID to each of the wafers received in the slots of a single wafer cassette, the present invention is capable of enhancing the productivity of the semiconductor fabricating equipment. The present invention can also be applied to all of the equipment of a semiconductor manufacturing line without adversely impacting upon the efficiency of the semiconductor manufacturing line. When the line is being used to produce products from large scale wafers, the flexibility of the line is dramatically increased.

Although the present invention has been described above in connection with the preferred embodiment thereof, many modifications, alternatives and variations to and of the preferred embodiment will be readily apparent to those of ordinary skill in the art. All such modifications, alternatives and variations are thus seen to be within the true spirit and scope of the present invention as defined by the appended claims.

What is claimed is:

1. A method of controlling semiconductor fabricating equipment, the method comprising:

taking a plurality of IDs assigned to wafers in a single lot, respectively, and correlating the wafer IDs with process step IDs assigning to each wafer the relative location of the wafer in the lot and processing data for each wafer;

correlating the process step IDs with process program IDs, respectively, each process program ID providing a program of how the semiconductor manufacturing equipment is to be operated to process a wafer in a manner based on said processing data;

formulating the correlated process program and process step IDs into process condition data for use in controlling the semiconductor fabricating equipment to individually process the wafers of the lot according to the programs provided by the process program IDs correlated to the wafers on the basis of the process step IDs;

determining whether a track-in signal, indicative of the approval of the process condition data, has been issued;

if the track-in signal has been issued, downloading the process condition data into a server of the semiconductor fabricating equipment;

whenever the process condition data is downloaded, changing any portion of an equipment control message, stored in the server, which is in disagreement with the downloaded process condition data to produce a new equipment control message; and controlling the semiconductor fabricating equipment to individually process the wafers of the lot, according to the programs provided by the process program IDs, by downloading the new equipment control message into the semiconductor fabricating equipment.

2. The method according to claim 1, and further comprising storing the equipment control message in the server as a stream function message.

3. The method according to claim 2, wherein the stream function message has an S2F41 format.

4. The method according to claim 1, wherein said correlating comprises searching a database of process step IDs and process program IDs stored in a host computer provided on-line with the semiconductor processing equipment.

5. The method according to claim 1, wherein said controlling comprises directing the semiconductor processing equipment to remove several wafers from a cassette, and to load each of the wafers once removed into one of several process chambers of the semiconductor processing equipment selected according to the process step ID and the PPID assigned to the wafer, prior to processing wafers stored in another cassette.

\* \* \* \* \*